United States Patent
Ippatapu

(10) Patent No.: US 10,998,918 B2
(45) Date of Patent: *May 4, 2021

(54) REDUCING THE AMOUNT OF DATA STORED IN A SEQUENCE OF DATA BLOCKS BY COMBINING DEDUPLICATION AND COMPRESSION

(71) Applicant: EMC IP Holding Company LLC, Hopkinton, MA (US)

(72) Inventor: Venkata L. R. Ippatapu, Westborough, MA (US)

(73) Assignee: EMC IP HOLDING COMPANY LLC, Hopkinton, MA (US)

(*) Notice: Subject to any disclaimer, the term of this patent is extended or adjusted under 35 U.S.C. 154(b) by 0 days.

This patent is subject to a terminal disclaimer.

(21) Appl. No.: 16/846,909

(22) Filed: Apr. 13, 2020

(65) Prior Publication Data

US 2020/0350926 A1 Nov. 5, 2020

Related U.S. Application Data

(63) Continuation of application No. 16/398,623, filed on Apr. 30, 2019, now Pat. No. 10,659,076.

(51) Int. Cl.
   *H03M 7/30* (2006.01)
   *H03M 7/40* (2006.01)
(52) U.S. Cl.
   CPC ....... *H03M 7/3091* (2013.01); *H03M 7/3059* (2013.01); *H03M 7/405* (2013.01)
(58) Field of Classification Search
   CPC ... H03M 7/3091; H03M 7/3059; H03M 7/405
   (Continued)

(56) References Cited

U.S. PATENT DOCUMENTS 5,544,347 A   8/1996   Yanai et al.
5,729,223 A   3/1998   Trissel
(Continued)

OTHER PUBLICATIONS

Non-Final Office Action received for U.S. Appl. No. 16/398,623 dated Dec. 12, 2019, 19 pages.

(Continued)

*Primary Examiner* — Lam T Mai
(74) *Attorney, Agent, or Firm* — Amin, Turocy & Watson, LLP

(57) ABSTRACT

The described technology is generally directed towards reducing the amount of data stored in a sequence of data blocks by combining deduplication and compression. According to an embodiment, a system can comprise a memory that can store computer executable components, and a processor that can execute the components stored in the memory. The components can comprise a data block identifier that can identify, for a sequence of data blocks, a first data block that corresponds to a first data, resulting in a first identified data block, and a deduplication component that can identify a second data block that corresponds to the first data, resulting in a second identified data block, wherein the deduplication component can replace the second identified data block with a key value corresponding to the first identified data block. Further, a compression component can compress the first identified data block, resulting in a compressed data block.

20 Claims, 10 Drawing Sheets

(58) Field of Classification Search
USPC .................................................. 341/50–90
See application file for complete search history.

(56) References Cited

U.S. PATENT DOCUMENTS

| | | | |
|---|---|---|---|
| 5,742,792 A | 4/1998 | Yanai et al. | |
| 5,761,690 A | 6/1998 | Dao et al. | |
| 6,851,087 B1* | 2/2005 | Sibert | G06F 40/174 |
| | | | 715/236 |
| 6,968,369 B2 | 11/2005 | Veprinsky et al. | |
| 7,054,883 B2 | 5/2006 | Meiri et al. | |
| 8,081,231 B2 | 12/2011 | Kikuchi | |
| 8,261,097 B2* | 9/2012 | Kubo | H04L 9/0897 |
| | | | 713/193 |
| 8,711,883 B2* | 4/2014 | Kang | H04L 65/605 |
| | | | 370/477 |
| 8,818,953 B2* | 8/2014 | Yingst | G06F 16/235 |
| | | | 707/643 |
| 9,571,698 B1 | 2/2017 | Wallace et al. | |
| 9,711,333 B2 | 7/2017 | Sieber et al. | |
| 10,235,064 B1 | 3/2019 | Natanzon et al. | |
| 10,261,708 B1 | 4/2019 | Ippatapu et al. | |
| 10,409,495 B1 | 9/2019 | Baruch et al. | |
| 10,659,076 B1* | 5/2020 | Ippatapu | H03M 7/3091 |
| 2002/0097172 A1 | 7/2002 | Fallon | |
| 2008/0207120 A1 | 8/2008 | Kurina et al. | |
| 2013/0024460 A1 | 1/2013 | Peterson et al. | |
| 2018/0364917 A1 | 12/2018 | Ki et al. | |
| 2019/0361621 A1* | 11/2019 | S | G06F 3/0608 |

OTHER PUBLICATIONS

Notice of Allowance dated Aug. 30, 2019 for U.S. Appl. No. 15/728,758, 8 pages.
Ippatapu, et al. "Host Data Replication Using Deduplication and Binary Search Trees." U.S. Appl. No. 15/728,758, filed Oct. 10, 2017. 61 pages.
Non-Final Office Action dated Apr. 9, 2019 for U.S. Appl. No. 15/728,758, 9 pages.
Windley, et al. "Binary search tree," Retrieved from hhttps://en.wikipedia.org/wiki/Binary_search_tree, Jul. 24, 2019, 11 pages.

* cited by examiner

600

```
                    ⎯ 610A
Struct
{                                    ⎯ 620
      UInt16 num_data_blocks;
      UInt16 chunk_size;   ⎯ 630          ⎯ 640
      T_DATA_BLOCK_INFO * data_block_info[256];
} T_METADATA_HEADER;
                          ⎯ 650
         ⎯ 610B
Struct
{                                     ⎯ 660
      UInt16 data_len_after_compression;
      UInt8  opcode;   ⎯ 670
} T_DATA_BLOCK_INFO
                      ⎯ 680
```

FIG. 6

REDUCING THE AMOUNT OF DATA STORED IN A SEQUENCE OF DATA BLOCKS BY COMBINING DEDUPLICATION AND COMPRESSION

RELATED APPLICATION

The subject patent application is a continuation of, and claims priority to, U.S. patent application Ser. No. 16/398,623 (now U.S. Pat. No. 10,659,076), filed Apr. 30, 2019, and entitled "REDUCING THE AMOUNT OF DATA STORED IN A SEQUENCE OF DATA BLOCKS BY COMBINING DEDUPLICATION AND COMPRESSION," the entirety of which application is hereby incorporated by reference herein.

TECHNICAL FIELD

The subject application generally relates to data storage and communications, and, for example, to adaptive deduplication and compression of data, and related embodiments.

BACKGROUND

Modern data systems can require the storage and communication of increasing amounts of data. Reducing the size of this data can reduce both the cost and time associated with storing and communicating the data.

In some circumstances, removing duplicate data can be used to reduce the size of the data, but this operation does not result in size reduction when the data does not have a lot of duplicates. Alternatively, data compression can reduce the size of non-duplicate data, but using this approach can cause deduplication to either not be performed, or performed with substantial overhead.

SUMMARY

This Summary is provided to introduce a selection of representative concepts in a simplified form that are further described below in the Detailed Description. This Summary is not intended to identify key features or essential features of the claimed subject matter, nor is it intended to be used in any way that would limit the scope of the claimed subject matter.

According to an embodiment, a system can comprise a memory that stores computer executable components and a processor that can execute the computer executable components stored in the memory. The computer executable components can comprise a data block identifier that can identify, for a sequence of data blocks, a first data block that corresponds to a first data, resulting in a first identified data block, and a deduplication component that can identify a second data block that corresponds to the first data, resulting in a second identified data block, wherein the deduplication component can replace the second identified data block with a key value corresponding to the first identified data block. Further, a compression component can compress the first identified data block, resulting in a compressed data block.

According to another embodiment, a computer-implemented method can comprise receiving, by a first device comprising a processor, from a second device, a sequence of elements, wherein respective ones of the sequence of elements comprise blocks of data. The method can further comprise decompressing, by the first device, a compressed block of data of a first element of the sequence of elements, resulting in a first block of data comprised in the first element. The method can further comprise storing, by the first device, a copy of the first block of data as a second block of data comprised in a second element, wherein the storing the first block of data is based on a key value referencing the first element.

According to another embodiment, a computer program product is provided. The computer program product can comprise machine-readable storage medium comprising executable instructions that, when executed by a processor, can facilitate performance of operations comprising identifying a first data block in the sequence of data blocks that corresponds to a first data, resulting in a first identified data block. The operations can further comprise identifying a second data block in the sequence of data blocks that corresponds to the first data, resulting in a second identified data block, wherein the second identified data block is replaced by a key value corresponding to the first identified data block. The operations can further comprise compressing the first identified data block, resulting in a compressed data block.

BRIEF DESCRIPTION OF THE DRAWINGS

The technology described herein is illustrated by way of example and not limited in the accompanying figures in which like reference numerals indicate similar elements, and in which:

FIG. 6 depicts a non-limiting sample of computer code that can configure the operation of one or more embodiments.

DETAILED DESCRIPTION

Various aspects described herein are generally directed towards facilitating reducing the amount of data stored in a sequence of data blocks by combining deduplication and compression, in accordance with one or more embodiments. As will be understood, the implementation(s) described herein are non-limiting examples, and variations to the technology can be implemented.

Reference throughout this specification to "one embodiment," "one or more embodiments," "an embodiment," "one implementation," "an implementation," etc. means that a particular feature, structure, or characteristic described in connection with the embodiment/implementation is included in at least one embodiment/implementation. Thus, the appearances of such a phrase "in one embodiment," "in an implementation," etc. in various places throughout this specification are not necessarily all referring to the same embodiment/implementation. Furthermore, the particular features, structures, or characteristics may be combined in any suitable manner in one or more embodiments/implementations.

The computer processing systems, computer-implemented methods, apparatus and/or computer program products described herein employ hardware and/or software to solve problems that are highly technical in nature (e.g., reducing the amount of data stored in a sequence of data blocks by combining deduplication and compression), that are not abstract and cannot be performed as a set of mental acts by a human. For example, a human, or even a plurality of humans, cannot efficiently integrate data compression (which generally cannot be performed manually by a human) and deduplication, with the same level of accuracy and/or efficiency as the various embodiments described herein.

Aspects of the subject disclosure will now be described more fully hereinafter with reference to the accompanying drawings in which example components, graphs and operations are shown. In the following description, for purposes of explanation, numerous specific details are set forth in order to provide a thorough understanding of the various embodiments. However, the subject disclosure may be embodied in many different forms and should not be construed as limited to the examples set forth herein.

Figure 1:
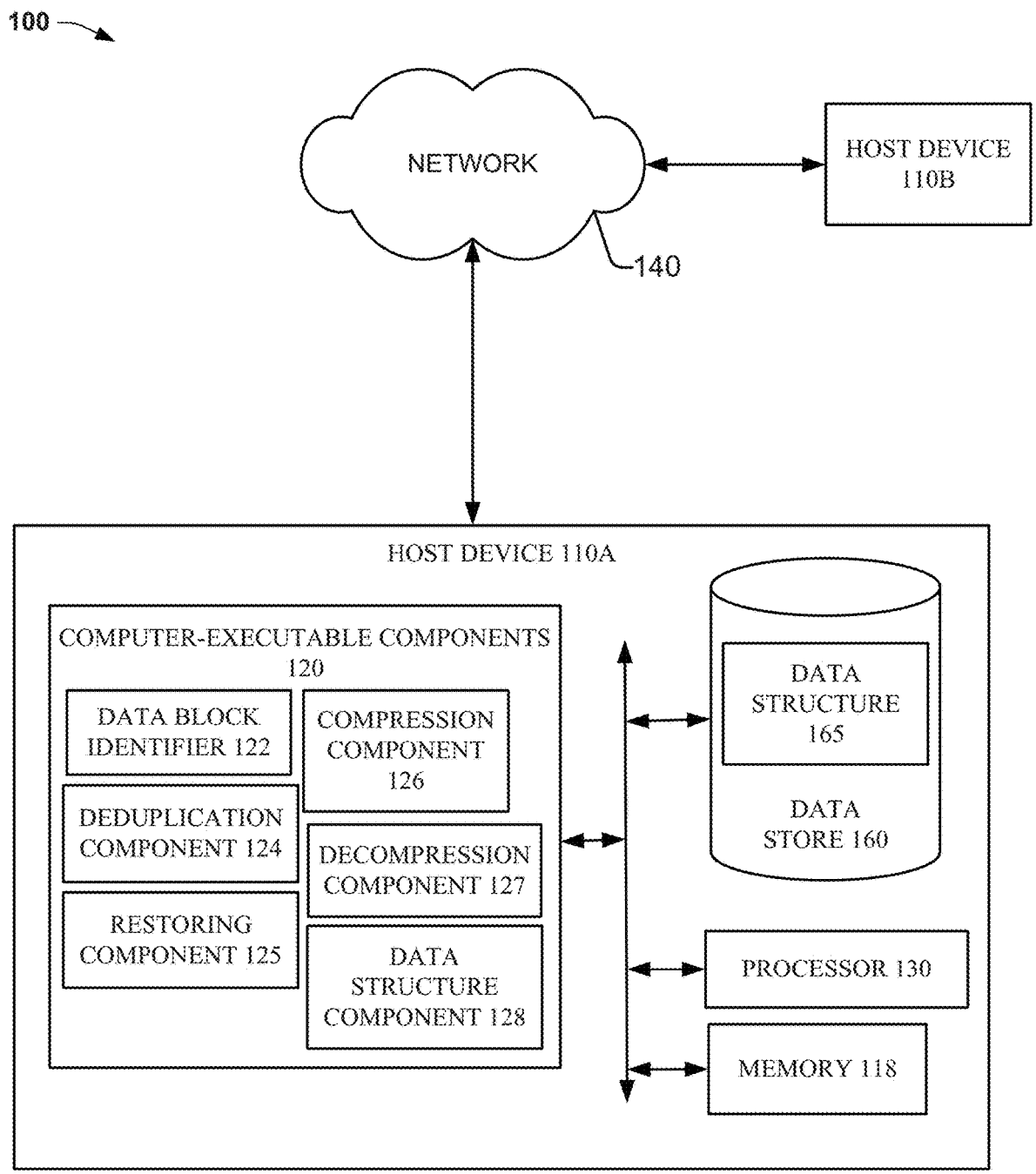
FIG. 1 illustrates a block diagram of an example, non-limiting system that can facilitate reducing the amount of data stored in a sequence of data blocks by combining deduplication and compression, in accordance with various aspects and implementations of the subject disclosure.

FIG. 1 illustrates a block diagram of an example, non-limiting system 100 that can facilitate reducing the amount of data stored in a sequence of data blocks by combining deduplication and compression, in accordance with various aspects and implementations of the subject disclosure.

As depicted, host device 110A can be coupled to another host device 110B by employing network 140. In some embodiments, processor 130 can comprise one or more of a central processing unit, multi-core processor, microprocessor, dual microprocessors, microcontroller, System on a Chip (SOC), array processor, vector processor, and/or another type of processor. Further examples of processor 130 are described below with reference to processing unit 1014 and FIG. 10. Such examples can be employed with any embodiments of the subject disclosure.

As discussed further below with FIG. 10, in some embodiments, memory 118 can comprise volatile memory (e.g., random access memory (RAM), static RAM (SRAM), dynamic RAM (DRAM), etc.) and/or non-volatile memory (e.g., read only memory (ROM), programmable ROM (PROM), electrically programmable ROM (EPROM), electrically erasable programmable ROM (EEPROM), etc.) that can employ one or more memory architectures. Further examples of memory 118 are described below with reference to system memory 1016 and FIG. 10. Such examples of memory 118 can be employed to implement any embodiments of the subject disclosure.

According to multiple embodiments, processor 130 can comprise one or more types of processors and/or electronic circuitry that can implement one or more computer and/or machine readable, writable, and/or executable components and/or instructions that can be stored on memory 118. For example, processor 130 can perform various operations that can be specified by such computer and/or machine readable, writable, and/or executable components and/or instructions including, but not limited to, logic, control, input/output (I/O), arithmetic, and/or the like.

In one or more embodiments, in an example approach to performing the operations above, processor 130 can execute computer-executable components 120, including data block identifier 122, deduplication component 124, restoring component 125, compression component 126, decompression component 127, and data structure component 128.

Data store 160 can provide persistent storage to one or more embodiments, including by employing the use of data structure 165. Generally speaking, in some circumstances, data structures can be used to organize data so as to facilitate the performance of different operations, e.g., manipulation and searching. Because one or more embodiments described herein can use both of these operations extensively, some implementations described herein can use a data structure.

For example, a binary search tree can be used to facilitate rapid searching, with every element in the tree is a structure which can hold both a key value and a data value, and with elements of the binary search tree being represented by assigned key values. These data structures can be useful for implementation of some embodiments described herein because they can facilitate fast lookup, addition and removal of items. It should be appreciated however, that this example is not intended to be limiting, and data structures can be used to implement one or more embodiments. The above example is non-limiting, and it should be noted that other approaches to manipulating and searching operations can be used to implement one or more embodiments, including, but not limited to, directly modifying and performing linear searches on, an array.

Figure 2:
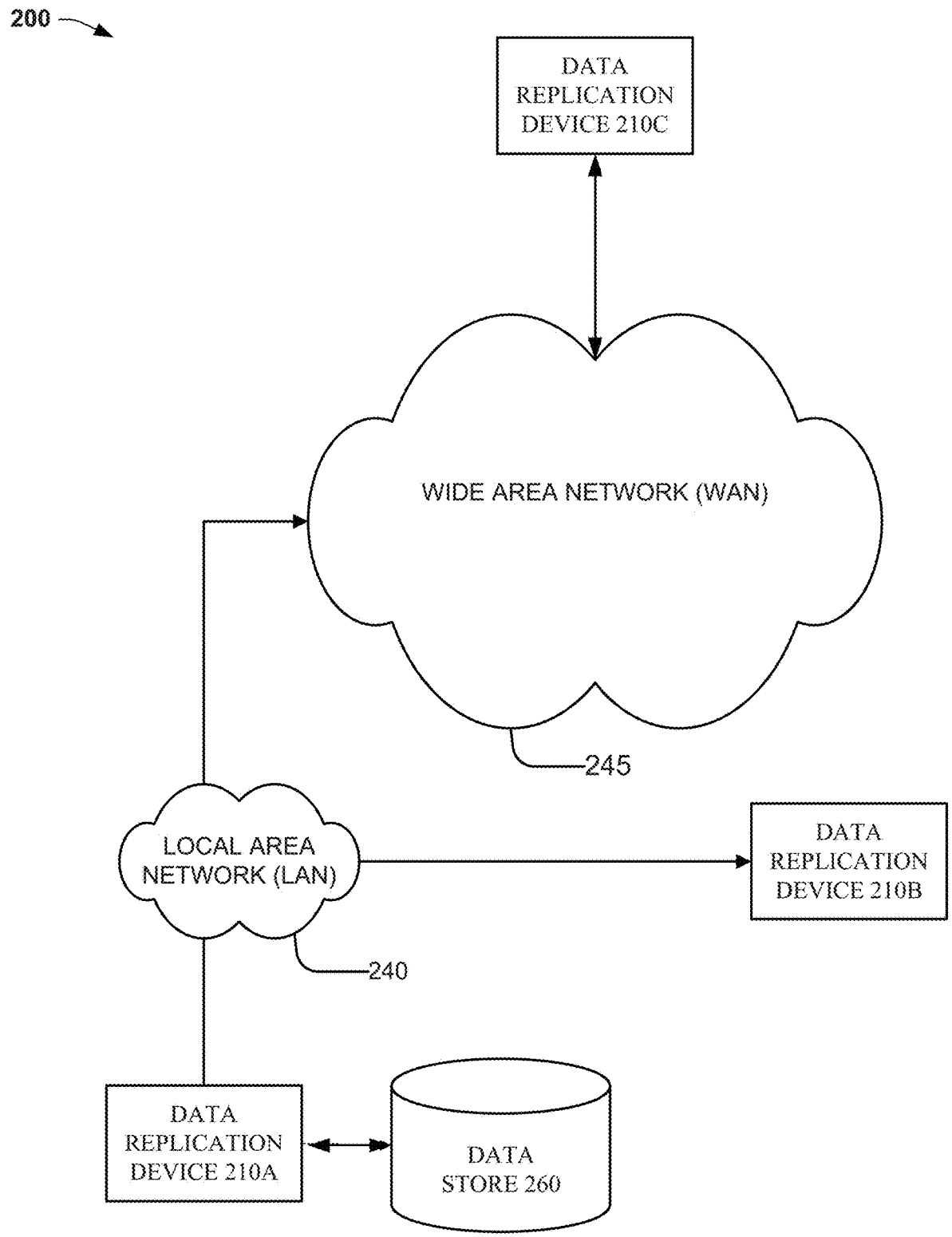
FIG. 2 illustrates an implementation of an example, non-limiting system that can facilitate reducing the amount of data stored in a sequence of data blocks by combining deduplication and compression, in accordance with one or more embodiments described herein.

FIG. 2 illustrates an implementation of an example, non-limiting system 200 that can facilitate reducing the amount of data stored in a sequence of data blocks by combining deduplication and compression in a data protection system, in accordance with one or more embodiments described herein. Repetitive description of like elements and/or processes employed in respective embodiments is omitted for sake of brevity.

An example system that can benefit in some circumstances from the use of one or more embodiments, is a data protection system. In different implementations. Data protection systems can copy host data from primary storage in computing device to secondary storage. For data protection systems that can utilize remote data replication, the systems can copy data from one geographical location to a remote secondary storage device located on a different location, e.g., for disaster recovery and fault tolerance, e.g., the SRDF System provided by DELL EMC, discussed above.

This figure depicts an example implementation of one or more embodiments where some of the features of example host devices 110A-B of FIG. 1 are embodied in data replication devices 210A-C. Data replication device 210A can be coupled to other data replication devices (e.g., data replication devices 210B-C) by employing both local area network (LAN) 140 and wide area network (WAN) 145. As used herein, WAN 245 can be a network that can connect computer devices over a wide geographical area, e.g., a municipal network, national network, and global network.

Use of WAN 245 to connect data replication device 210A to data replication device 210C can add additional potential shortcomings compared to connections employing LAN 240. For example, problems that include, but are not limited to customer limited network bandwidth pipes, round trip time (RTT) latency, packet drops, packet timeouts, and re-transmits, can also occur more frequently with the use of WAN 245.

Data protection systems can benefit from the data reduction of one or more embodiments at least because these systems can store large amounts of data (e.g., by employing data store 260) and can communicate large amounts of data over network connections (e.g., by employing LAN 240 and WAN 245). Data reduction can improve both the cost and performance of both of these operations.

Figure 3:
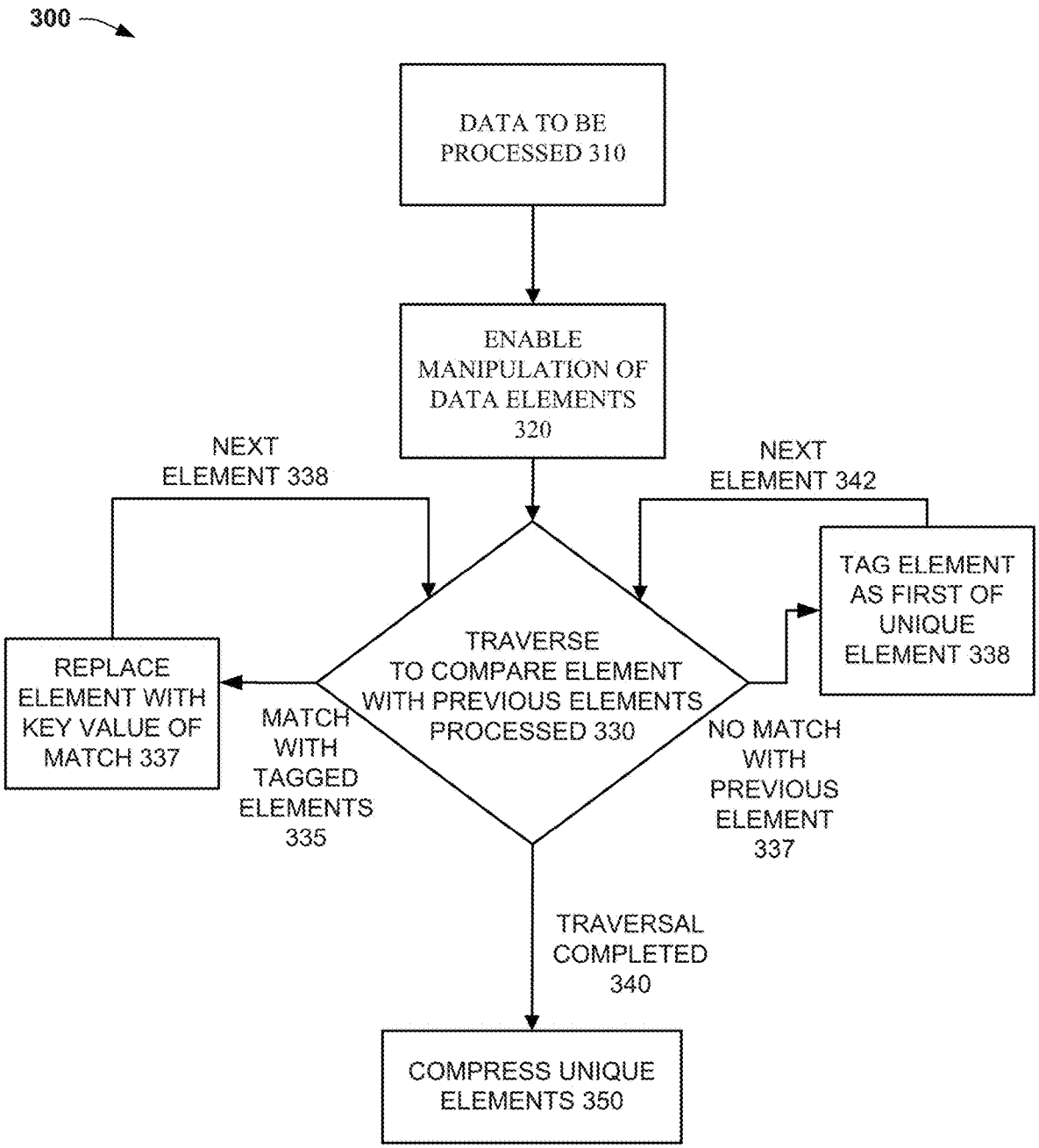
FIGS. 3-4 respectively provide a flow diagram and a sample sequence of elements to describe different embodiments discussed herein.
Figure 4:
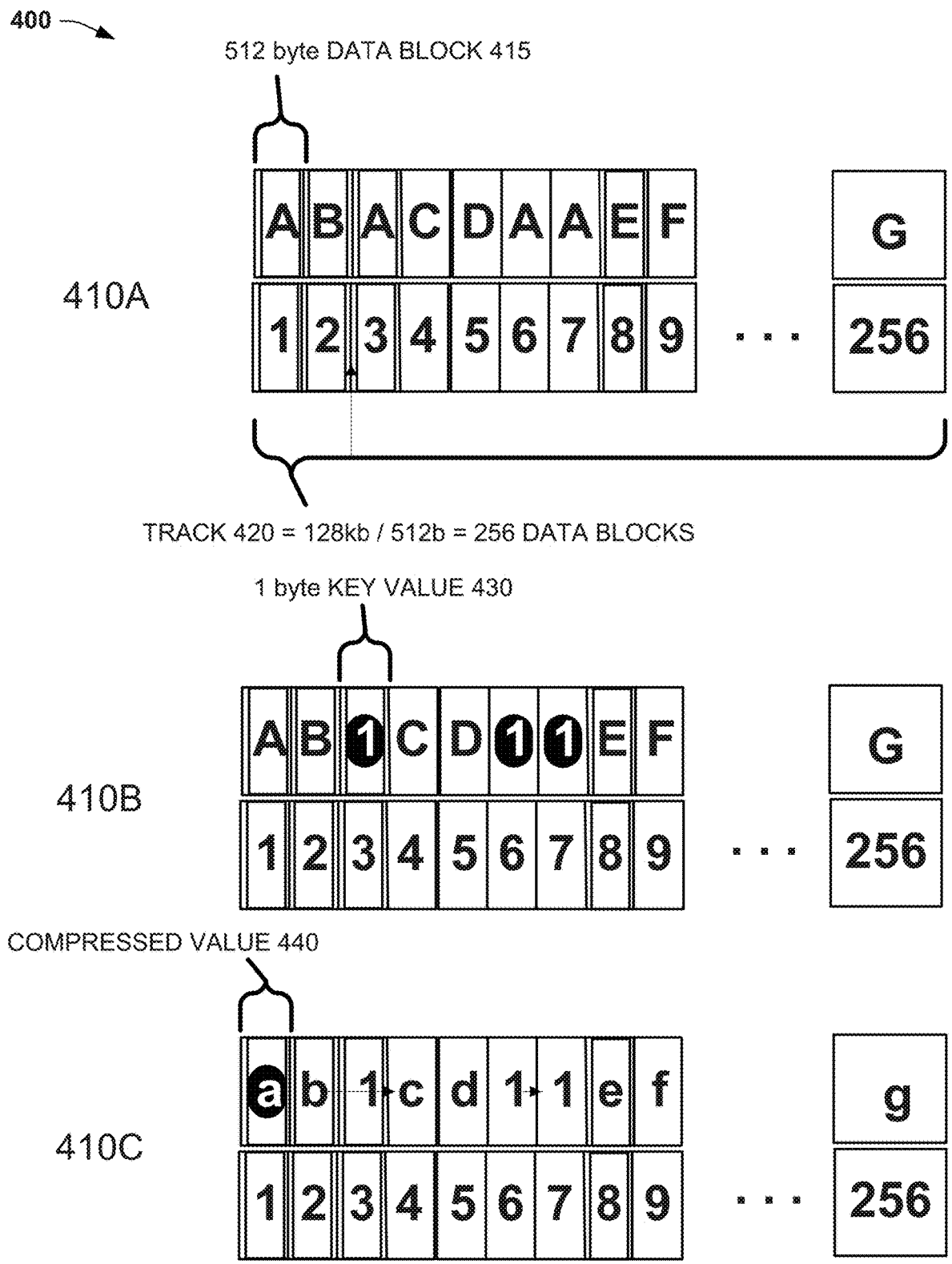

FIGS. 3-4 respectively provide a flow diagram 300 and a sample sequence of elements 400 to describe different embodiments discussed herein. Repetitive description of like elements and/or processes employed in respective embodiments is omitted for sake of brevity.

At block 310 the data to be processed is identified. One or more embodiments can divide blocks of data into blocks of a particular size. This selected block size can have a relationship to some part of the system for which the processes described herein are performed. For example, in data replication system discussed with FIG. 2 above, data is being reduced before communication to another host, where is can be recovered back to its unreduced size. In this application the selected data block size can be based on data sizes associated with the physical aspects of the system, e.g., data store 160 as a storage device in the Symmetrix System discussed above. Thus, because in this example, storage devices are divided into tracks, tracks are divided into data blocks, these data blocks can be used as the information unit upon which one or more embodiments can operate.

As depicted in FIG. 4, furthering this connection between one or more embodiments and system hardware, one or more embodiments discussed herein operate on sequences of a particular number of elements (e.g., data blocks 415), and in the example data replication system discussed above, for 128 kb track 420, there are 256 data blocks 415 of 512 bytes. Thus, returning to block 310 in FIG. 3, in this example, track 420 of a physical drive is identified for processing. It is important to note that the above example is non-limiting and alternative implementations can have more or fewer data blocks, of different sizes, that can also be unrelated to physical storage devices.

At block 320, the manipulation (e.g., duplicate removal and compression) of the identified data blocks can be enabled, e.g., by buffering the data using different approaches. As discussed above, because the processing performed by one or more embodiments can involve searching, a data structure designed for searching can be used (e.g., binary search trees), but any approach to manipulating the identified data blocks can be used, without departing from the spirit of the embodiments described herein.

In this example, for simplicity, FIG. 4 provides a simple, 256 element data structure 410A-C with a bottom row providing a position in the data block, e.g., which $512b$ data block is referenced, e.g., data block B4 corresponding to the 4th $512b$ block. As discussed in additional detail below, in this example, the top row can store either a data value (e.g., the $512b$ of data in the 4th position), a compressed version of the data value, or a key value (e.g., one byte) that can correspond to another position in the data block. Thus, in the initial collection of data 410A, data blocks B1-B256 contain capital letters A-G, as shorthand for $512b$ of uncompressed unique data.

At block 330, one or more embodiments can traverse the sequence of data blocks, e.g., B1-B256 of 410A, to compare the elements with previous elements processed. In one or more embodiments, traversal begins at B1, and the value (e.g., $512b$) stored at this block can be compared to all other blocks that have been processed (e.g., none), and if no match with any previous element 337, data block B1 can be tagged as a unique element 338. Tagging can occur in different ways, including but not limited to, in metadata of the data block, or in an external data source, e.g., a list of unique key values. At discussed further below, the unique value in block B1 can be compressed by one or more embodiments, after deduplication.

Continuing with this example, data block B2 is also tagged as unique, based on the process described with block B1 above. As depicted in data blocks 410B, when one or more embodiments processes block B3 according to the block 330 of FIG. 3, because the "A" value has been processed previously with block B1, there is a match with previously tagged elements 335. Thus, in block 337, the "A" value in block B3 can be replaced with a key value 430 that references block B1, as the first instance of the "A" value processed. In an implementation, because there are 256 data blocks, one byte of data can be used to reference any of the data blocks in 430B, and thus deduplication has reduced the size of the data by 511 bytes. As depicted, data blocks B6-B7 are also processed in this way, e.g., having data values stored in these blocks replaced with a reference to data block B1.

Once traversal of the sequence of elements is completed 340, at block 350, the elements identified (e.g., in block 340) as being unique can be compressed. Thus, as depicted in 410C, data block B1 contains a compressed value 440 with a lower-case "a" to indicate a compressed "A" value. Also having unique values, data blocks B2, B4, B5, B8, B9, and B256 are also compressed.

As discussed further with FIG. 6 below, the sequence of elements, as well as the elements individually, can have metadata that describe different characteristics of the system. For example, after the completion of block 350 above, metadata header information for elements can be updated to store information about the current state of the data, e.g., which blocks contain key value references to unique values (e.g., were subject to deduplication) and which elements are compressed, unique instances. As discussed with FIG. 5 below, this information can be used for a data recovery process.

Figure 5:
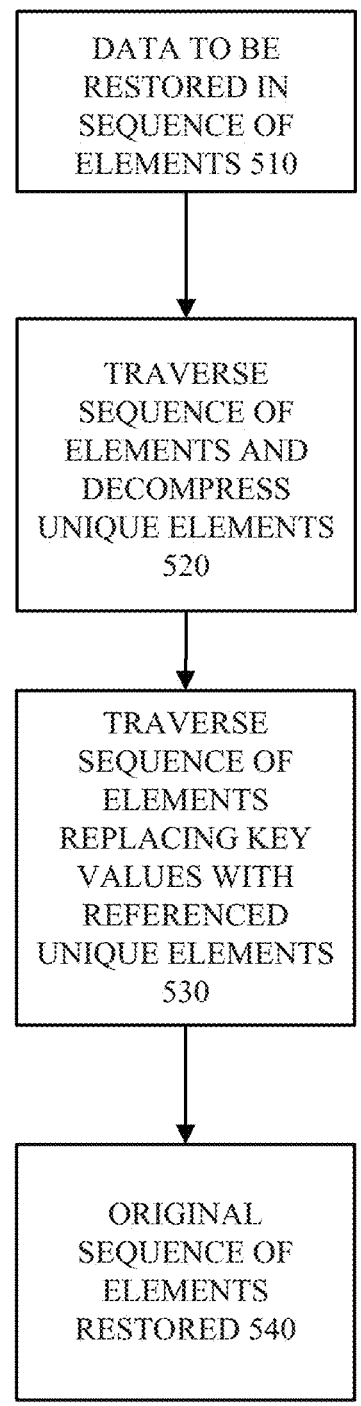
FIG. 5 depicts a flow diagram of a non-limiting, example process by which data can be recovered after the deduplication and compression processes described above, in accordance with one or more embodiments.

FIG. 5 depicts a flow diagram 500 of a non-limiting, example process by which data can be recovered after the deduplication and compression processes described above, in accordance with one or more embodiments. Repetitive description of like elements and/or processes employed in respective embodiments is omitted for sake of brevity.

In block 510, similar to block 320 discussed above, manipulation of the data to be restored can be enabled using any approach, such as buffering. In block 520, the sequence of elements (e.g., data blocks 410C) can be traversed, and decompression can be performed on the compressed elements, e.g., based on a metadata indication that a data block contains compressed data. Thus, as shown in the transition from data blocks 410C to 410B, the lower case letters representing compressed $512b$ blocks are returned to upper-case.

In block 530, the sequence of data blocks 410B can be traversed again, and the key values associated with the remaining data blocks can be replaced with the, now uncompressed, data stored in these blocks. Thus, as depicted in the transition from data blocks 410B to 410A, the key value of 1 stored in memory block B3 can reference the "A" stored in memory block B1, and this value can replace the key value for memory block B3, as well as memory blocks B6-B7 by the same process. After this distribution of the unique values to the data blocks with key values, the original data can have been restored 540.

It should be noted that, in this non-limiting example, the decompression step occurs before the restoration of the removed duplicate data, e.g., the decompressed data is copied to the destination data blocks. In one or more embodiments, this can be performed for different reasons, including, but not limited to, the overhead saved by only having to decompress the compressed data once.

FIG. 6 depicts a non-limiting sample of computer code 600 that can configure the operation of one or more embodiments to facilitate reducing the amount of data stored in a sequence of data blocks by combining deduplication and compression. Repetitive description of like elements and/or processes employed in respective embodiments is omitted for sake of brevity.

It should be noted that while the computer code depicted in FIG. 6 is example code from a computer language with custom data types, any computer programming language can have code that performs similar functions. Commands 610A-B are new data type commands, and list out members of each data type, including for 610A, instances of the 610B data type. Command 610B defines a data type 680 that describes information about a particular data block, having a member 660 that includes a variable to hold the length of the data after compression, and member 670 that includes an operation code that can specify whether the data is in its original form, a compressed form, or a pointer to another instance of the data, e.g., in this example, 0, 1, and 2, respectively. Command 610A creates a data type 650 for the entire sequence of data blocks, and includes a member 620 to define the number of data blocks (e.g., 256 as with FIG. 4 above) and a member 630 for chunk size, e.g., the size of each data block element, e.g., 512b described above. This data type can also provide an array of the 610B command data type, e.g., one for each of the data blocks.

Figure 7:
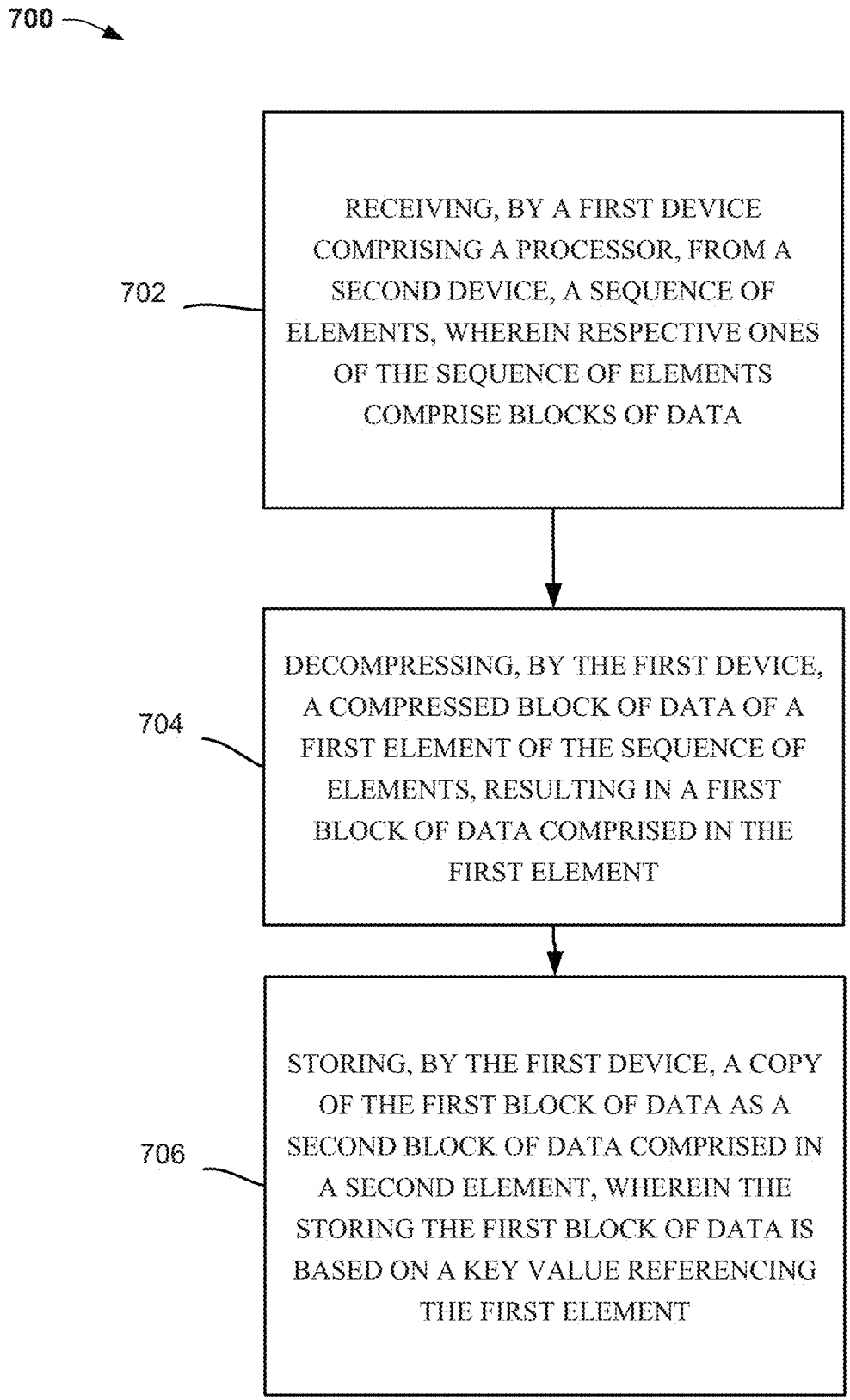
FIG. 7 illustrates an example flow diagram for a method that can facilitate reducing the amount of data stored in a sequence of data blocks by combining deduplication and compression, in accordance with one or more embodiments.

FIG. 7 illustrates an example flow diagram for a method 700 that can facilitate reducing the amount of data stored in a sequence of data blocks by combining deduplication and compression, in accordance with one or more embodiments. For purposes of brevity, description of like elements and/or processes employed in other embodiments is omitted.

At element 702, method 700 can comprise receiving, by a first device (e.g., host device 110A) comprising a processor 130, from a second device (e.g., host device 110B), a sequence of elements (e.g., data blocks 410C), wherein respective ones of the sequence of elements comprise blocks of data (e.g., B1-B256 of data blocks 410C).

At element 704, method 700 can comprise decompressing, by the first device (e.g., host device 110A), a compressed block (e.g., data block 410C) of data of a first element (e.g., block B1 of data blocks 410C) of the sequence of elements, resulting in a first block of data (e.g., lower case "a" decompressed to uppercase "A" in transition from data blocks 410C to 410B) comprised in the first element.

At element 706, method 700 can comprise storing, by the first device (e.g., host device 110A), a copy of the first block of data (e.g., the uppercase "A" in block B1) as a second block (e.g., storing "A" in block B3 of data blocks 410A) of data comprised in a second element, wherein the storing the first block of data (e.g., the transition between data blocks 410B and 410A) is based on a key value (e.g., the key value of 1 in block B3 of data blocks 410B) referencing the first element (e.g., block B1).

Figure 8:
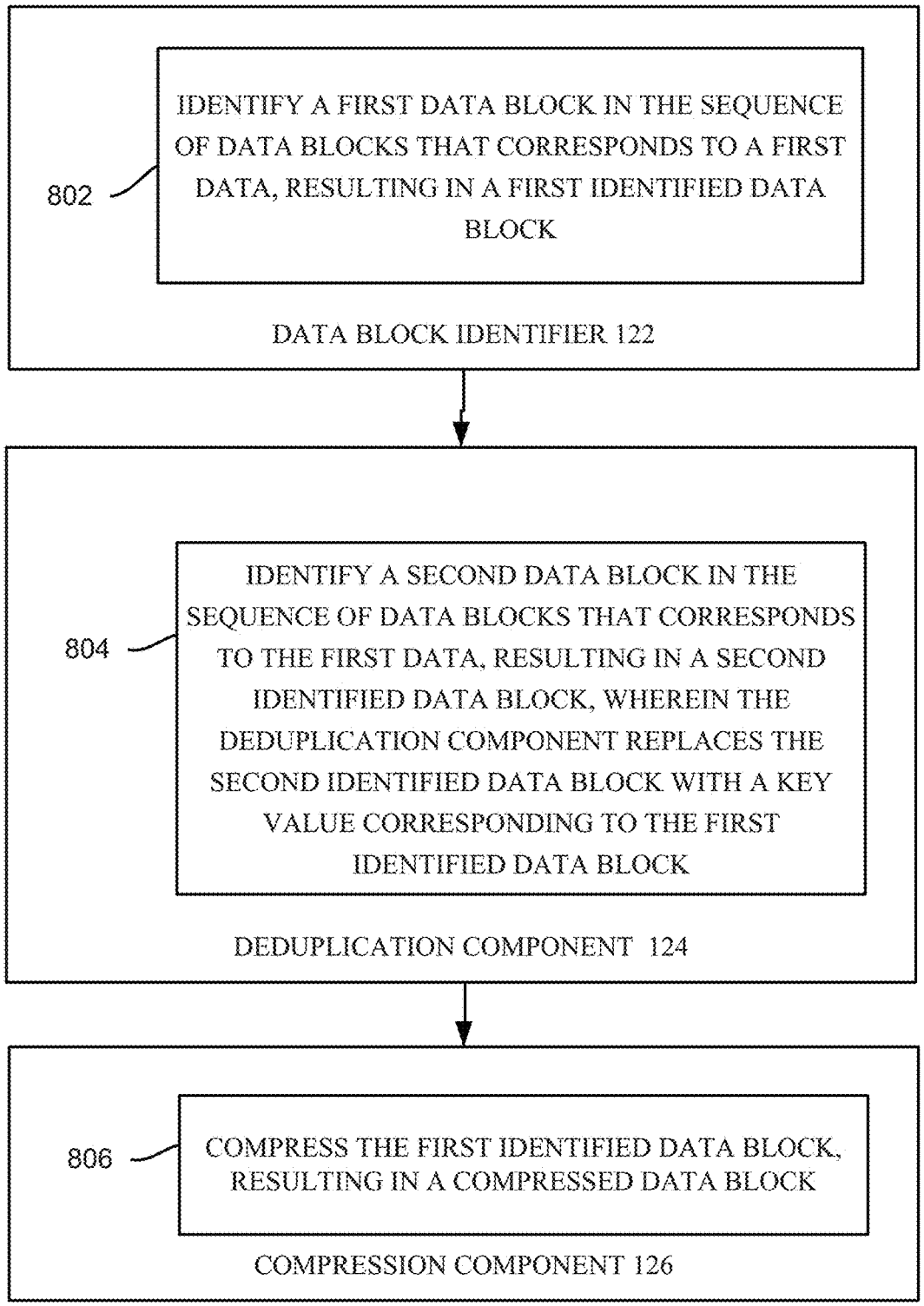
FIG. 8 is a flow diagram representing example operations of system comprising data block identifier, deduplication component, and compression component, in accordance with one or more embodiments.

FIG. 8 is a flow diagram representing example operations of system comprising data block identifier 122, deduplication component 124, and compression component 126, in accordance with one or more embodiments. For purposes of brevity, description of like elements and/or processes employed in other embodiments is omitted.

Data block identifier 122 can be configured 802 to identify a first data block (e.g., data block B1 in data blocks 410A) in the sequence of data blocks that corresponds to a first data (e.g., "A"), resulting in a first identified data block.

Deduplication component 124 can be configured to identify a second data block (e.g., block B3 in data blocks 410B) in the sequence of data blocks that corresponds to the first data (e.g., block B3 also contains an "A"), resulting in a second identified data block, wherein the deduplication component replaces the second identified data block (e.g., the transition between data blocks 410A and 410B) with a key value corresponding to the first identified data block (e.g., block B3 of data blocks 410B contains a key value that references block B1).

Compression component 126 can be configured to compress the first identified data block, resulting in a compressed data block (e.g., the transition between data blocks 410B and 410C, with the uppercase "A" being compressed to a lowercase "a" in block B1).

Figure 9:
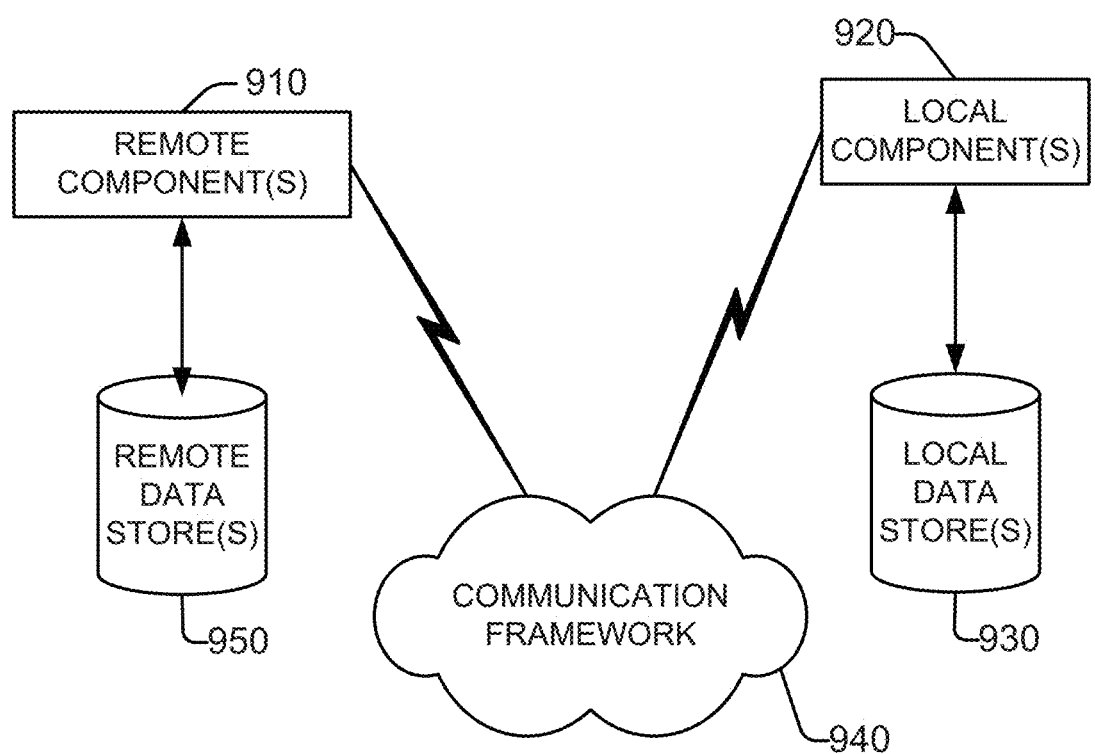
FIG. 9 depicts an example schematic block diagram of a computing environment with which the disclosed subject matter can interact, in accordance with one or more embodiments.

FIG. 9 is a schematic block diagram of a system 900 with which the disclosed subject matter can interact. The system 900 comprises one or more remote component(s) 910. The remote component(s) 910 can be hardware and/or software (e.g., threads, processes, computing devices). In some embodiments, remote component(s) 910 can be a distributed computer system, connected to a local automatic scaling component and/or programs that use the resources of a distributed computer system, via communication framework 940. Communication framework 940 can comprise wired network devices, wireless network devices, mobile devices, wearable devices, radio access network devices, gateway devices, femtocell devices, servers, etc.

The system 900 also comprises one or more local component(s) 920. The local component(s) 920 can be hardware and/or software (e.g., threads, processes, computing devices).

One possible communication between a remote component(s) 910 and a local component(s) 920 can be in the form of a data packet adapted to be transmitted between two or more computer processes. Another possible communication between a remote component(s) 910 and a local component(s) 920 can be in the form of circuit-switched data adapted to be transmitted between two or more computer processes in radio time slots. The system 900 comprises a communication framework 940 that can be employed to facilitate communications between the remote component(s) 910 and the local component(s) 920, and can comprise an air interface, e.g., Uu interface of a UMTS network, via a long-term evolution (LTE) network, etc. Remote component(s) 910 can be operably connected to one or more remote data store(s) 950, such as a hard drive, solid state drive, SIM card, device memory, etc., that can be employed to store information on the remote component(s) 910 side of communication framework 940. Similarly, local component(s) 920 can be operably connected to one or more local data store(s) 930, that can be employed to store information on the local component(s) 920 side of communication framework 940.

In order to provide a context for the various aspects of the disclosed subject matter, FIG. 8, and the following discussion, are intended to provide a brief, general description of a suitable environment in which the various aspects of the disclosed subject matter can be implemented. While the subject matter has been described above in the general context of computer-executable instructions of a computer program that runs on a computer and/or computers, those skilled in the art will recognize that the disclosed subject matter also can be implemented in combination with other program modules. Generally, program modules comprise routines, programs, components, data structures, etc. that performs particular tasks and/or implement particular abstract data types.

In the subject specification, terms such as "store," "storage," "data store," "data storage," "database," and substantially any other information storage component relevant to operation and functionality of a component, refer to "memory components," or entities embodied in a "memory" or components comprising the memory. It is noted that the memory components described herein can be either volatile memory or nonvolatile memory, or can comprise both volatile and nonvolatile memory, by way of illustration, and not limitation, volatile memory 1020 (see below), non-volatile memory 1022 (see below), disk storage 1024 (see below), and memory storage, e.g., local data store(s) 930 and remote data store(s) 950, see below. Further, nonvolatile memory can be included in read only memory, programmable read only memory, electrically programmable read only memory, electrically erasable read only memory, or flash memory. Volatile memory can comprise random access memory, which acts as external cache memory. By way of illustration and not limitation, random access memory is available in many forms such as synchronous random access memory, dynamic random access memory, synchronous dynamic random access memory, double data rate synchronous dynamic random access memory, enhanced synchronous dynamic random access memory, SynchLink dynamic random access memory, and direct Rambus random access memory. Additionally, the disclosed memory components of systems or methods herein are intended to comprise, without being limited to comprising, these and any other suitable types of memory.

Moreover, it is noted that the disclosed subject matter can be practiced with other computer system configurations, comprising single-processor or multiprocessor computer systems, mini-computing devices, mainframe computers, as well as personal computers, hand-held computing devices (e.g., personal digital assistant, phone, watch, tablet computers, netbook computers, . . . ), microprocessor-based or programmable consumer or industrial electronics, and the like. The illustrated aspects can also be practiced in distributed computing environments where tasks are performed by remote processing devices that are linked through a communications network; however, some if not all aspects of the subject disclosure can be practiced on stand-alone computers. In a distributed computing environment, program modules can be located in both local and remote memory storage devices.

Figure 10:
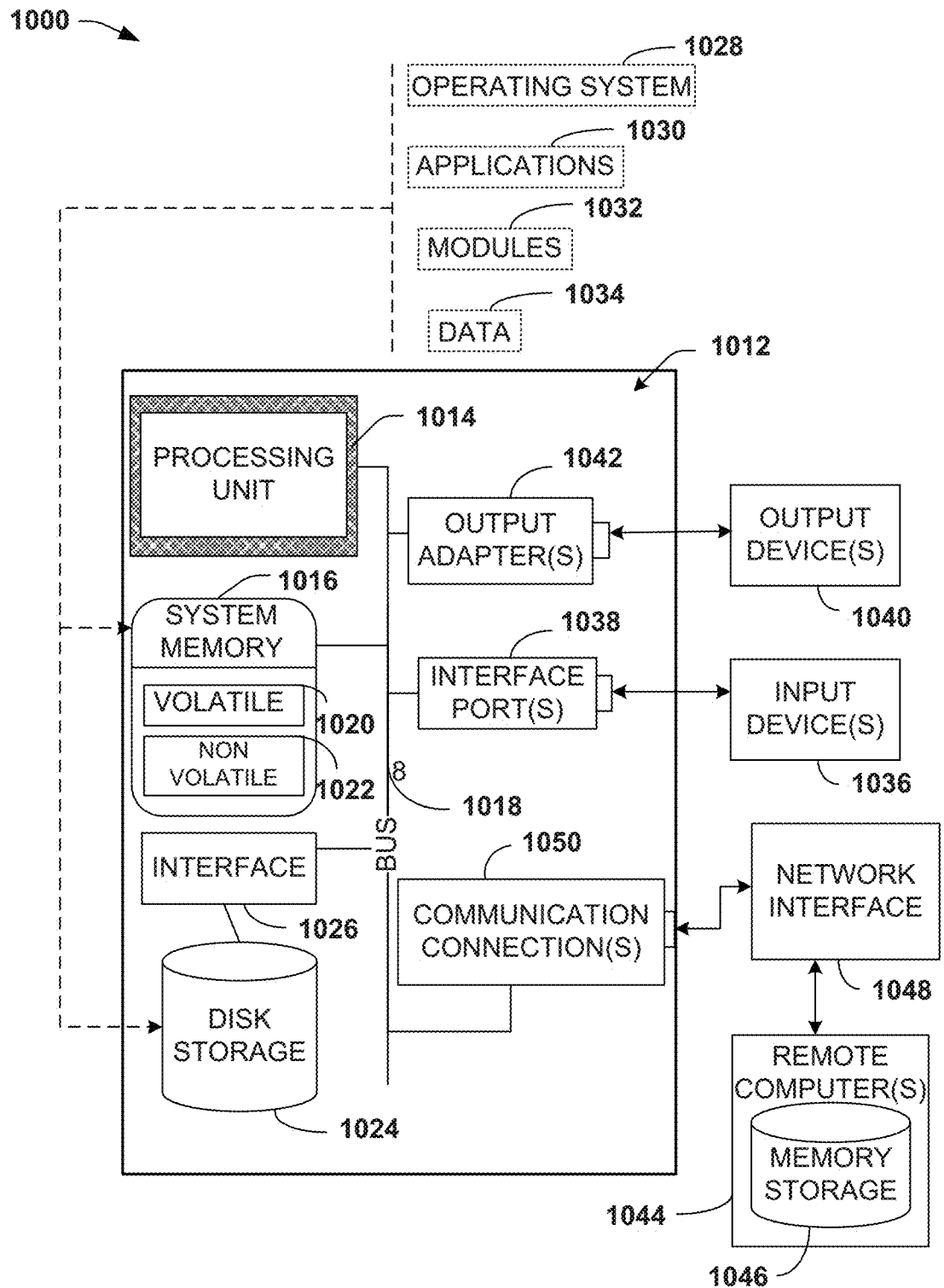
FIG. 10 illustrates an example block diagram of a computing system operable to execute the disclosed systems and methods in accordance with various aspects and implementations of the subject disclosure.

FIG. 10 illustrates a block diagram of a computing system 1000 operable to execute the disclosed systems and methods in accordance with one or more embodiments/implementations described herein. Computer 1012 can comprise a processing unit 1014, a system memory 1016, and a system bus 1018. System bus 1018 couples system components comprising, but not limited to, system memory 1016 to processing unit 1014. Processing unit 1014 can be any of various available processors. Dual microprocessors and other multiprocessor architectures also can be employed as processing unit 1014.

System bus 1018 can be any of several types of bus structure(s) comprising a memory bus or a memory controller, a peripheral bus or an external bus, and/or a local bus using any variety of available bus architectures comprising, but not limited to, industrial standard architecture, micro-channel architecture, extended industrial standard architecture, intelligent drive electronics, video electronics standards association local bus, peripheral component interconnect, card bus, universal serial bus, advanced graphics port, personal computer memory card international association bus, Firewire (Institute of Electrical and Electronics Engineers 1394), and small computer systems interface.

System memory 1016 can comprise volatile memory 1020 and non-volatile memory 1022. A basic input/output system, containing routines to transfer information between elements within computer 1012, such as during start-up, can be stored in non-volatile memory 1022. By way of illustration, and not limitation, non-volatile memory 1022 can comprise read only memory, programmable read only memory, electrically programmable read only memory, electrically erasable read only memory, or flash memory. Volatile memory 1020 comprises read only memory, which acts as external cache memory. By way of illustration and not limitation, read only memory is available in many forms such as synchronous random access memory, dynamic read only memory, synchronous dynamic read only memory, double data rate synchronous dynamic read only memory, enhanced synchronous dynamic read only memory, SynchLink dynamic read only memory, Rambus direct read only memory, direct Rambus dynamic read only memory, and Rambus dynamic read only memory.

Computer 1012 can also comprise removable/non-removable, volatile/non-volatile computer storage media. FIG. 10 illustrates, for example, disk storage 1024. Disk storage 1024 comprises, but is not limited to, devices like a magnetic disk drive, floppy disk drive, tape drive, flash memory card, or memory stick. In addition, disk storage 1024 can comprise storage media separately or in combination with other storage media comprising, but not limited to, an optical disk drive such as a compact disk read only memory device, compact disk recordable drive, compact disk rewritable drive or a digital versatile disk read only memory. To facilitate connection of the disk storage 1024 to system bus 1018, a removable or non-removable interface is typically used, such as interface 1026.

Computing devices typically comprise a variety of media, which can comprise computer-readable storage media or communications media, which two terms are used herein differently from one another as follows.

Computer-readable storage media can be any available storage media that can be accessed by the computer and comprises both volatile and nonvolatile media, removable and non-removable media. By way of example, and not limitation, computer-readable storage media can be implemented in connection with any method or technology for storage of information such as computer-readable instructions, program modules, structured data, or unstructured data. Computer-readable storage media can comprise, but are not limited to, read only memory, programmable read only memory, electrically programmable read only memory, electrically erasable read only memory, flash memory or other memory technology, compact disk read only memory, digital versatile disk or other optical disk storage, magnetic cassettes, magnetic tape, magnetic disk storage or other magnetic storage devices, or other tangible media which can be used to store desired information. In this regard, the term "tangible" herein as may be applied to storage, memory or computer-readable media, is to be understood to exclude only propagating intangible signals per se as a modifier and does not relinquish coverage of all standard storage, memory or computer-readable media that are not only propagating intangible signals per se. In an aspect, tangible media can comprise non-transitory media wherein the term "non-transitory" herein as may be applied to storage, memory or computer-readable media, is to be understood to exclude only propagating transitory signals per se as a modifier and does not relinquish coverage of all standard storage, memory or computer-readable media that are not only propagating transitory signals per se. Computer-readable storage media can be accessed by one or more local or remote computing devices, e.g., via access requests, queries or other data retrieval protocols, for a variety of operations with respect to the information stored by the medium. As such, for example, a computer-readable medium can comprise executable instructions stored thereon that, in response to execution, can cause a system comprising a processor to perform operations, comprising determining a mapped cluster schema, altering the mapped cluster schema until a rule is satisfied, allocating storage space according to the mapped cluster schema, and enabling a data operation corresponding to the allocated storage space, as disclosed herein.

Communications media typically embody computer-readable instructions, data structures, program modules or other structured or unstructured data in a data signal such as a modulated data signal, e.g., a carrier wave or other transport mechanism, and comprises any information delivery or transport media. The term "modulated data signal" or signals refers to a signal that has one or more of its characteristics set or changed in such a manner as to encode information in one or more signals. By way of example, and not limitation, communication media comprise wired media, such as a wired network or direct-wired connection, and wireless media such as acoustic, RF, infrared and other wireless media.

It can be noted that FIG. 10 describes software that acts as an intermediary between users and computer resources described in a suitable operating environment, e.g., computing system 1000. Such software comprises an operating system 1028. Operating system 1028, which can be stored on disk storage 1024, acts to control and allocate resources of computer 1012. System applications 1030 take advantage of the management of resources by operating system 1028 through program modules 1032 and program data 1034 stored either in system memory 1016 or on disk storage 1024. It is to be noted that the disclosed subject matter can be implemented with various operating systems or combinations of operating systems.

A user can enter commands or information into computer 1012 through input device(s) 1036. In some embodiments, a user interface can allow entry of user preference information, etc., and can be embodied in a touch sensitive display panel, a mouse/pointer input to a graphical user interface (GUI), a command line controlled interface, etc., allowing a user to interact with computer 1012. Input devices 1036 comprise, but are not limited to, a pointing device such as a mouse, trackball, stylus, touch pad, keyboard, microphone, joystick, game pad, satellite dish, scanner, TV tuner card, digital camera, digital video camera, web camera, cell phone, smartphone, tablet computer, etc. These and other input devices connect to processing unit 1014 through system bus 1018 by way of interface port(s) 1038. Interface port(s) 1038 comprise, for example, a serial port, a parallel port, a game port, a universal serial bus, an infrared port, a Bluetooth port, an IP port, or a logical port associated with a wireless service, etc. Output device(s) 1040 use some of the same type of ports as input device(s) 1036.

Thus, for example, a universal serial bus port can be used to provide input to computer 1012 and to output information from computer 1012 to an output device 1040. Output adapter 1042 is provided to illustrate that there are some output devices 1040 like monitors, speakers, and printers, among other output devices 1040, which use special adapters. Output adapters 1042 comprise, by way of illustration and not limitation, video and sound cards that provide means of connection between output device 1040 and system bus 1018. It should be noted that other devices and/or systems of devices provide both input and output capabilities such as remote computer(s) 1044.

Computer 1012 can operate in a networked environment using logical connections to one or more remote computers, such as remote computer(s) 1044. Remote computer(s) 1044 can be a personal computer, a server, a router, a network PC, cloud storage, a cloud service, code executing in a cloud computing environment, a workstation, a microprocessor-based appliance, a peer device, or other common network node and the like, and typically comprises many or all of the elements described relative to computer 1012. A cloud computing environment, the cloud, or other similar terms can refer to computing that can share processing resources and data to one or more computer and/or other device(s) on an as needed basis to enable access to a shared pool of configurable computing resources that can be provisioned and released readily. Cloud computing and storage solutions can store and/or process data in third-party data centers which can leverage an economy of scale and can view accessing computing resources via a cloud service in a manner similar to a subscribing to an electric utility to access electrical energy, a telephone utility to access telephonic services, etc.

For purposes of brevity, only a memory storage device 1046 is illustrated with remote computer(s) 1044. Remote computer(s) 1044 is logically connected to computer 1012 through a network interface 1048 and then physically connected by way of communication connection 1050. Network interface 1048 encompasses wire and/or wireless communication networks such as local area networks and wide area networks. Local area network technologies comprise fiber distributed data interface, copper distributed data interface, Ethernet, Token Ring and the like. Wide area network technologies comprise, but are not limited to, point-to-point links, circuit-switching networks like integrated services digital networks and variations thereon, packet switching networks, and digital subscriber lines. As noted below, wireless technologies may be used in addition to or in place of the foregoing.

Communication connection(s) 1050 refer(s) to hardware/software employed to connect network interface 1048 to system bus 1018. While communication connection 1050 is shown for illustrative clarity inside computer 1012, it can also be external to computer 1012. The hardware/software for connection to network interface 1048 can comprise, for example, internal and external technologies such as modems, comprising regular telephone grade modems, cable modems and digital subscriber line modems, integrated services digital network adapters, and Ethernet cards.

The above description of illustrated embodiments of the subject disclosure, comprising what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

As it employed in the subject specification, the term "processor" can refer to substantially any computing processing unit or device comprising, but not limited to comprising, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit, a digital signal processor, a field programmable gate array, a programmable logic controller, a complex programmable logic device, a discrete gate or transistor logic, discrete hardware components, or any combination thereof designed to perform the functions described herein. Processors can exploit nano-scale architectures such as, but not limited to, molecular and quantum-dot based transistors, switches and gates, in order to optimize space usage or enhance performance of user equipment. A processor may also be implemented as a combination of computing processing units.

As used in this application, the terms "component," "system," "platform," "layer," "selector," "interface," and the like are intended to refer to a computer-related entity or an entity related to an operational apparatus with one or more specific functionalities, wherein the entity can be either hardware, a combination of hardware and software, software, or software in execution. As an example, a component may be, but is not limited to being, a process running on a processor, a processor, an object, an executable, a thread of execution, a program, and/or a computer. By way of illustration and not limitation, both an application running on a server and the server can be a component. One or more components may reside within a process and/or thread of execution and a component may be localized on one computer and/or distributed between two or more computers. In addition, these components can execute from various computer readable media having various data structures stored thereon. The components may communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or a firmware application executed by a processor, wherein the processor can be internal or external to the apparatus and executes at least a part of the software or firmware application. As yet another example, a component can be an apparatus that provides specific functionality through electronic components without mechanical parts, the electronic components can comprise a processor therein to execute software or firmware that confers at least in part the functionality of the electronic components.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances.

While the various embodiments are susceptible to various modifications and alternative constructions, certain illustrated implementations thereof are shown in the drawings and have been described above in detail. It should be understood, however, that there is no intention to limit the various embodiments to the specific forms disclosed, but on the contrary, the intention is to cover all modifications, alternative constructions, and equivalents falling within the spirit and scope of the various embodiments.

In addition to the various implementations described herein, it is to be understood that other similar implementations can be used or modifications and additions can be made to the described implementation(s) for performing the same or equivalent function of the corresponding implementation(s) without deviating therefrom. Still further, multiple processing chips or multiple devices can share the performance of one or more functions described herein, and similarly, storage can be effected across a plurality of devices. Accordingly, the various embodiments are not to be limited to any single implementation, but rather are to be construed in breadth, spirit and scope in accordance with the appended claims.

What is claimed is:

1. A method, comprising:
identifying, by a device comprising a processor, for a sequence of data elements, a first data element in the sequence of data elements that corresponds to first data, resulting in a first identified data element, and a second data element in the sequence of data elements that corresponds to the first data, resulting in a second identified data element; and
replacing, by the device, the second identified data element with a key value corresponding to the first identified data element.

2. The method of claim 1, further comprising compressing, by the device, the first identified data element, resulting in a compressed data element.

3. The method of claim 2, further comprising replacing, by the device, the first identified data element with the compressed data element.

4. The method of claim 2, further comprising tagging, by the device, the first identified data element to be compressed, and wherein the compressing the first identified data element comprises compressing the first identified data element based on the tagging of the first identified data element.

5. The method of claim 4, wherein the first identified data element comprises a header portion that comprises metadata, wherein the tagging of the first identified data element comprises tagging the first identified data element by updating the metadata, resulting in updated metadata, and wherein the compressing the first identified data element comprises compressing the first identified data element based on the updated metadata.

6. The method of claim 2, wherein the sequence of data elements are comprised in a search tree data structure, wherein the identifying the first data element in the sequence of data elements comprises identifying the first data element based on a first search of the search tree data structure, wherein the identifying the second data element comprises identifying the second data element based on a second search of the search tree data structure, and wherein the method further comprises storing, by the device, the compressed data element in the search tree data structure.

7. The method of claim 6, further comprising, based on the first search of the search tree data structure, tagging, by the device, the first identified data element to be compressed, and wherein the compressing the first identified data element comprises compressing the first identified data element based on the tagging of the first identified data element.

8. The method of claim 6, wherein the search tree data structure comprises a binary search tree data structure.

9. The method of claim 2, further comprising:
    decompressing, by the device, the compressed data element resulting in a decompressed data element;
    replacing, by the device, the compressed data element with the decompressed data element;
    identifying, by the device for the sequence of data elements, the key value; and
    based on the key value, replacing, by the device, the key value with a copy of the decompressed data element.

10. A system, comprising:
    a processor; and
    a memory that stores executable instructions that, when executed by the processor, facilitate performance of operations, comprising:
        receiving a sequence of elements from a device, wherein respective ones of the sequence of elements comprise blocks of data;
        decompressing a compressed block of data of a first element of the sequence of elements, resulting in a first block of data comprised in the first element; and
        storing a copy of the first block of data as a second block of data comprised in a second element, wherein the storing the first block of data is based on a key value referencing the first element.

11. The system of claim 10, wherein the respective ones of the sequence of elements further comprise metadata that describes contents of the blocks of data comprised in the respective ones of the sequence of elements.

12. The system of claim 11, wherein the metadata comprised in the first element of the sequence of elements comprises a first indicator that the first element comprises compressed data, and wherein the decompressing the compressed block of data is based on the first indicator.

13. The system of claim 12, wherein the metadata comprised in the first element comprises a value corresponding to a length of the compressed block of data.

14. The system of claim 11, wherein the metadata comprised in the first element of the sequence of elements comprises a second indicator that the second element comprises the key value referencing the first element, and wherein the storing the copy of the first block of data is based on the second indicator.

15. The system of claim 10, wherein the operations further comprise copying data corresponding to the sequence of elements to a track of a storage device.

16. The system of claim 10, wherein the device is comprised in a data protection system and the sequence of elements corresponds to data replicated to the device based on the data protection system.

17. The system of claim 10, wherein the sequence of elements comprises metadata that describes aspects of the sequence of elements.

18. A non-transitory machine-readable medium comprising executable instructions that, when executed by a processor, facilitate performance of operations, the operations comprising:
    identifying, for a sequence of data elements, a first data element in the sequence of data elements that corresponds to first data, resulting in a first identified data element;
    identifying a second data element in the sequence of data elements that corresponds to the first data, resulting in a second identified data element; and
    replacing the second identified data element with a key value corresponding to the first identified data element.

19. The non-transitory machine-readable medium of claim 18, wherein the operations further comprise tagging the first identified data element to be compressed, and wherein the operations further comprise compressing the first identified data element is based on the tagging of the first identified data element.

20. The non-transitory machine-readable medium of claim 19, wherein the first identified data element comprises a header portion that comprises metadata, wherein the tagging of the first identified data element comprises updating the metadata, resulting in updated metadata, and wherein the compressing the first identified data element is based on the updated metadata.

* * * * *